United States Patent
Xu et al.

(10) Patent No.: US 10,600,348 B2
(45) Date of Patent: Mar. 24, 2020

(54) SCAN DRIVER AND A DRIVING METHOD OF SCAN DRIVER

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Jing Xu, Guangdong (CN); Tai-jiun Hwang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 198 days.

(21) Appl. No.: 15/740,875

(22) PCT Filed: Nov. 23, 2017

(86) PCT No.: PCT/CN2017/112620
§ 371 (c)(1),
(2) Date: Dec. 29, 2017

(87) PCT Pub. No.: WO2019/080234
PCT Pub. Date: May 2, 2019

(65) Prior Publication Data
US 2019/0385501 A1   Dec. 19, 2019

(30) Foreign Application Priority Data
Oct. 25, 2017  (CN) .......................... 2017 1 1017742

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01)

(58) Field of Classification Search
CPC ................. G09G 3/20; G09G 2310/02; G09G 2310/0267; G09G 2310/027; G09G 3/3275; G09G 3/3685
See application file for complete search history.

(56) References Cited

U.S. PATENT DOCUMENTS

| 8,160,428 | B2 | 4/2012 | Huang | |
|---|---|---|---|---|
| 2004/0160432 | A1* | 8/2004 | Kubota | G09G 3/20 345/204 |

(Continued)

FOREIGN PATENT DOCUMENTS

| CN | 101013566 A | 8/2007 |
|---|---|---|
| CN | 101540148 A | 9/2009 |

(Continued)

*Primary Examiner* — Gerald Johnson
(74) *Attorney, Agent, or Firm* — Hemisphere Law, PLLC; Zhigang Ma

(57) ABSTRACT

A scan driver and a driving method of scan driver are provided. The scan driver includes a first shift register and a second shift register respectively receiving a first clock signal and a second clock signal, a first initial pulse signal and a second initial pulse signal and according to a first scanning type or a second scanning type scans scan lines; a selection unit receiving selection signals to select the first shift register or the second shift register for scanning scan lines; a logic control unit receiving an output enable sign controls the outputting; a level shift unit outputting a level signal; an output amplifier amplifying the level signal and outputting to the scan lines. Therefore, it achieves to satisfy requirement of progressive scanning and non-sequential scanning.

11 Claims, 5 Drawing Sheets

(56) References Cited

U.S. PATENT DOCUMENTS

| | | | |
|---|---|---|---|
| 2004/0164945 A1* | 8/2004 | Toriumi | G09G 3/3688 345/99 |
| 2008/0158204 A1 | 7/2008 | Chang et al. | |
| 2014/0037043 A1* | 2/2014 | Yoon | G11C 19/00 377/64 |
| 2015/0221274 A1* | 8/2015 | Ishii | G09G 3/3677 345/690 |
| 2017/0124955 A1* | 5/2017 | Wang | G09G 3/3225 |

FOREIGN PATENT DOCUMENTS

| | | |
|---|---|---|
| CN | 102237055 A | 11/2011 |
| CN | 106205461 A | 12/2016 |
| CN | 107068105 A | 8/2017 |

\* cited by examiner

SCAN DRIVER AND A DRIVING METHOD OF SCAN DRIVER

RELATED APPLICATIONS

The present application is a National Phase of International Application Number PCT/CN2017/112620, filed Nov. 23, 2017, and claims the priority of China Application No. 201711017742.5 filed Oct. 25, 2017.

FIELD OF THE DISCLOSURE

The disclosure relates to a display technical field, and more particularly to a scan driver and a driving method of scan driver.

BACKGROUND

The existing scan driver (shown as FIG. 1) only could driving the type for progressive scanning (shown as FIG. 2 and FIG. 3) base on the shift register. In some circuit which has special function requirement, it needs to scan the scan line by non-sequential scanning, and the existing scan driver cannot to satisfy that.

SUMMARY

A technical problem to be solved by the disclosure is to provide a scan driver and a driving method of scan driver with satisfy requirement of progressive scanning and non-sequential scanning.

Furthermore, the disclosure further provides a scan driver, comprising a first shift register receiving a first clock signal and a first initial pulse signal from a controller according to a first scanning type scans scan lines;

a second shift register receiving a second clock signal and a second initial pulse signal from the controller according to a second scanning type scans scan lines;

a selection unit connecting the first shift register and the second shift register, which receiving selection signals from the controller to select the first shift register for scanning scan lines by the first scanning type or the second shift register for scanning scan lines by the second scanning type;

a logic control unit connecting the selection unit, which receiving an output enable signal from the controller and controls the outputting from an outputting terminal of a scanning driver according to the output enable signal;

a level shift unit connecting the logic control unit, which outputting a level signal; and an output amplifier connecting the level shift unit, which amplifying the level signal and outputting an amplifying level signal from the outputting terminal of the scanning driver to the scan lines;

wherein frequency of the first shift register is less than frequency of the second shift register, and the first shift register scans a valid region by progressive scanning, the second shift register scans invalid region by non-sequential scanning;

wherein the selection signals received by the selection unit from the controller include a first selection signal and a second selection signal, the selection unit selects the first shift register for scanning scan lines by the first scanning type according to receive the first selection signal, the selection unit selects the second shift register for scanning scan lines by the second scanning type according to receive the second selection signal.

According to another aspect of the disclosure, the disclosure further provides a scan driver, comprising:

a first shift register receiving a first clock signal and a first initial pulse signal from a controller according to a first scanning type scans scan lines;

a second shift register receiving a second clock signal and a second initial pulse signal from the controller according to a second scanning type scans scan lines;

a selection unit connecting the first shift register and the second shift register, which receiving selection signals from the controller to select the first shift register for scanning scan lines by the first scanning type or the second shift register for scanning scan lines by the second scanning type;

a logic control unit connecting the selection unit, which receiving an output enable signal from controller and controls the outputting from an outputting terminal of a scanning driver according to the output enable signal;

a level shift unit connecting the logic control unit, which outputting a level signal; and an output amplifier connecting the level shift unit, which amplifying the level signal and outputting an amplifying level signal from the outputting terminal of the scanning driver to the scan lines, According to another aspect of the disclosure, the disclosure further provides a driving method of scan driver, comprising:

receiving a first clock signal and a first initial pulse signal from a controller by a first shift register according to a first scanning type scans scan lines;

receiving a second clock signal and a second initial pulse signal from the controller by a second shift register according to a second scanning type scans scan lines;

receiving selection signals from the controller to selection unit for selecting the first shift register for scanning scan lines by the first scanning type or the second shift register for scanning scan lines by the second scanning type;

receiving an output enable signal from controller to a logic control unit and controls the outputting from an outputting terminal of a scanning driver according to the output enable signal;

outputting a level signal outputted by the level shift unit; and amplifying the level signal by an output amplifier and outputting an amplifying level signal from the outputting terminal of the scanning driver to the scan lines.

In sum: comparing with the existing technology, the scan driver and driving method of scan driver of this present invention is that using the first shift register to achieve progressive scanning and using the second shift register to achieve non-sequential scanning, and the selection unit receiving selection signals from the controller and select to work the first shift register or the second shift register. And then the logic control unit controls to outputting of the output terminal of scan driver. It achieves to satisfy requirement of progressive scanning and non-sequential scanning of scan driver.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
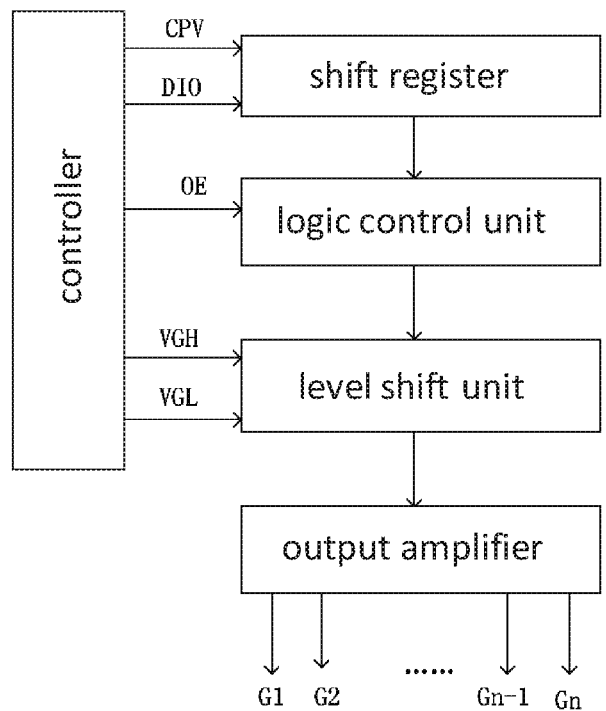
FIG. 1 is a prior art structural schematic view of a scan driver.
Figure 2:
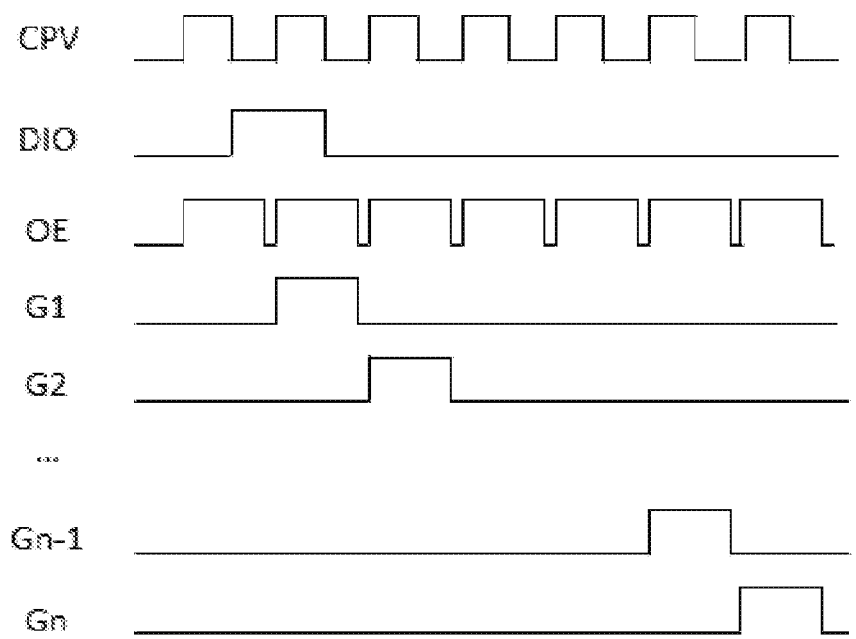
FIG. 2 is a schematic view of a signal timing of FIG. 1.
Figure 3:
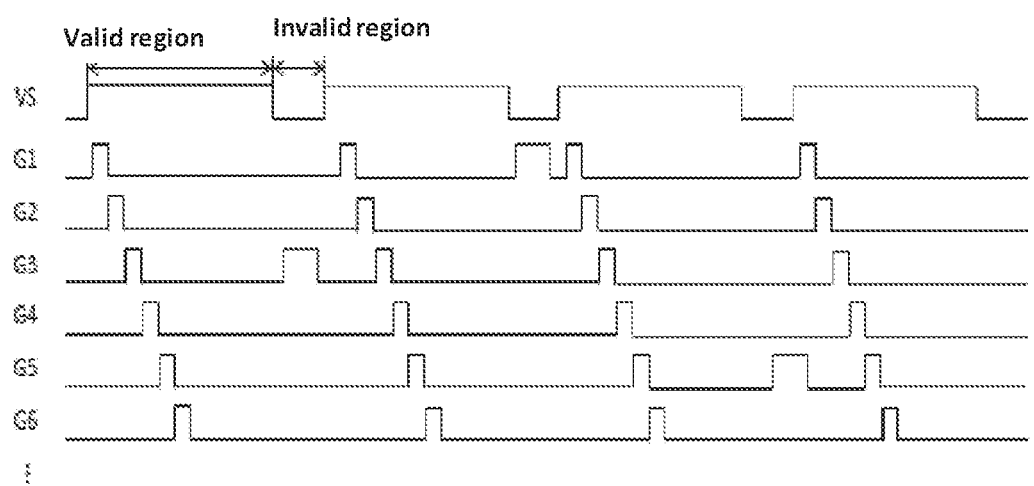
FIG. 3 is a prior art schematic view of an output waveform.
Figure 4:
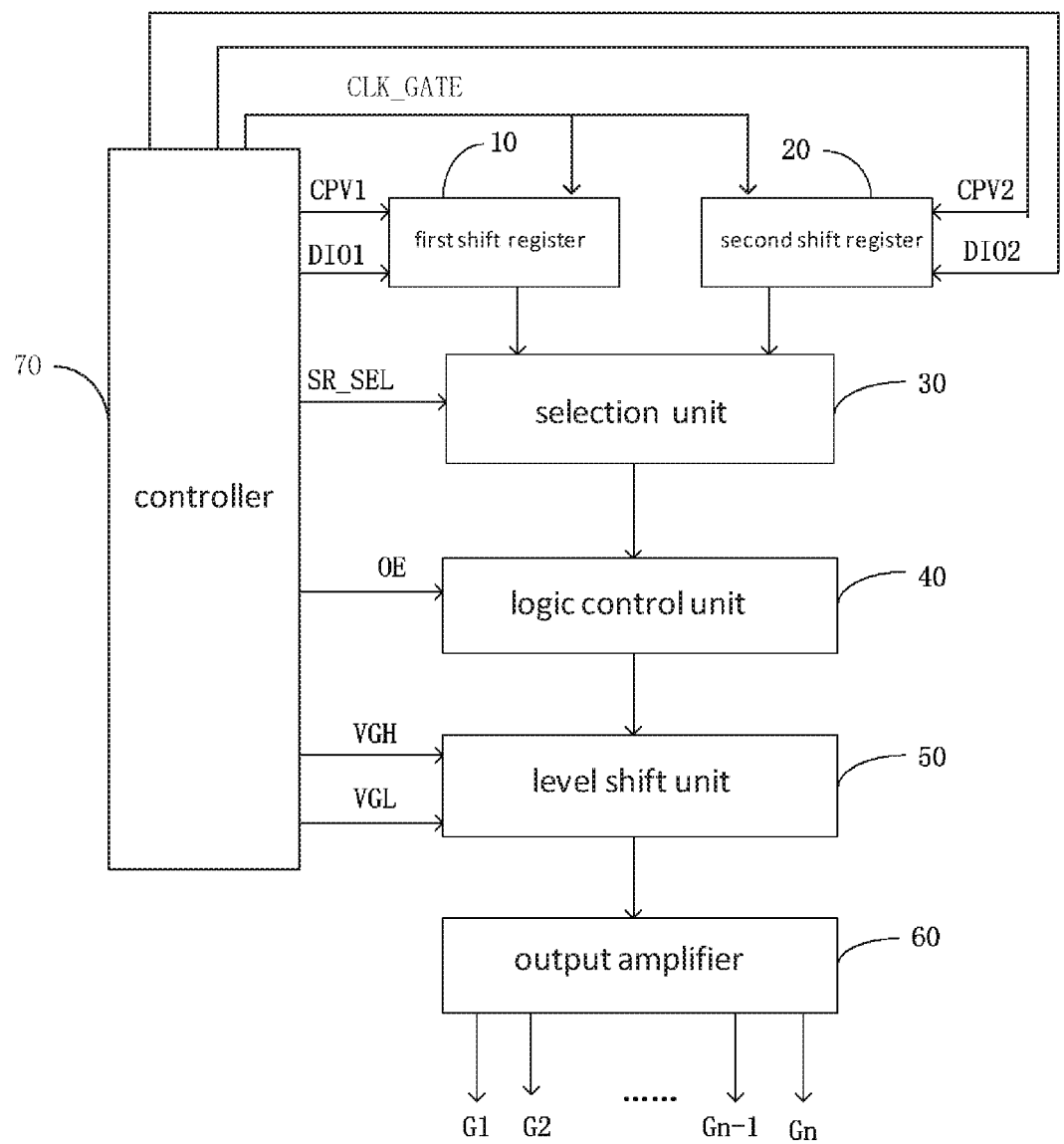
FIG. 4 is a structural schematic view of a scan driver according to an embodiment of the disclosure.

Please refer to FIG. 4. FIG. 4 is a structural schematic view of a scan driver according to an embodiment of the disclosure. The scan driver comprising a first shift register 10 receiving a first clock signal CPV1 and a first initial pulse signal DIO1 from a controller 70 according to a first scanning type scans scan lines.

The second shift register 20 receiving a second clock signal CPV2 and a second initial pulse signal DIO2 from the controller 70 according to a second scanning type scans scan lines.

The selection unit 30 is connecting the first shift register 10 and the second shift register 20, which receiving selection signals SR_SEL from the controller 70 to select the first shift register 10 for scanning scan lines by the first scanning type or the second shift register 20 for scanning scan lines by the second scanning type.

The logic control unit 40 is connecting the selection unit 30, which receiving an output enable signal OE from controller 70 and controls the outputting from an outputting terminal of a scanning driver according to the output enable signal OE.

The level shift unit 50 is connecting the logic control unit 40, which outputting a level signal.

The output amplifier 60 is connecting the level shift unit 50, which amplifying the level signal and outputting an amplifying level signal (the level signal is 1 or 0) from the outputting terminal Gn of the scanning driver to the scan lines.

In this embodiment, frequency of the first shift register 10 is less than frequency of the second shift register 20, and the first shift register 10 scans a valid region by progressive scanning, the second shift register 20 scans invalid region by non-sequential scanning.

Specifically, the selection signals SR_SEL received by the selection unit 30 from the controller 70 include a first selection signal and a second selection signal, the selection unit 30 selects the first shift register 10 for scanning scan lines by the first scanning type according to receive the first selection signal, the selection unit 30 selects the second shift register 20 for scanning scan lines by the second scanning type according to receive the second selection signal.

In this embodiment, the first shift register 10 and the second shift register 20 further receiving a gated clock signal CLK_GATE from the controller 70, and elongating enabling time of the scan lines by the gate clock signal CLK_GATE.

In this embodiment, the frequency the second clock signal CPV2 received by the second shift register 20 is according to formula $f_{CPV2} \geq (N-1)/(t_{VB}-t_{OPEN})$, wherein $f_{CPV2}$ is frequency of the second clock signal, N is number of scan lines, $t_{VB}$ is time of invalid time, $t_{OPEN}$ is enabling time of scan lines.

The maximum operating frequency of existing scan driving will not be over 350 KHZ, and because this frequency already satisfy existing using requirement. For example 4K2K UD @120 Hz, the frequency of scan driver is fCPV=2160*120=259.2 KHz, which could satisfy existing using requirement. Because the clock signal CPV directly applicants to the shift register, the frequency is effected by inner circuit of scan driver but not the shift register, so that the shift register could working on higher frequency.

Figure 5:
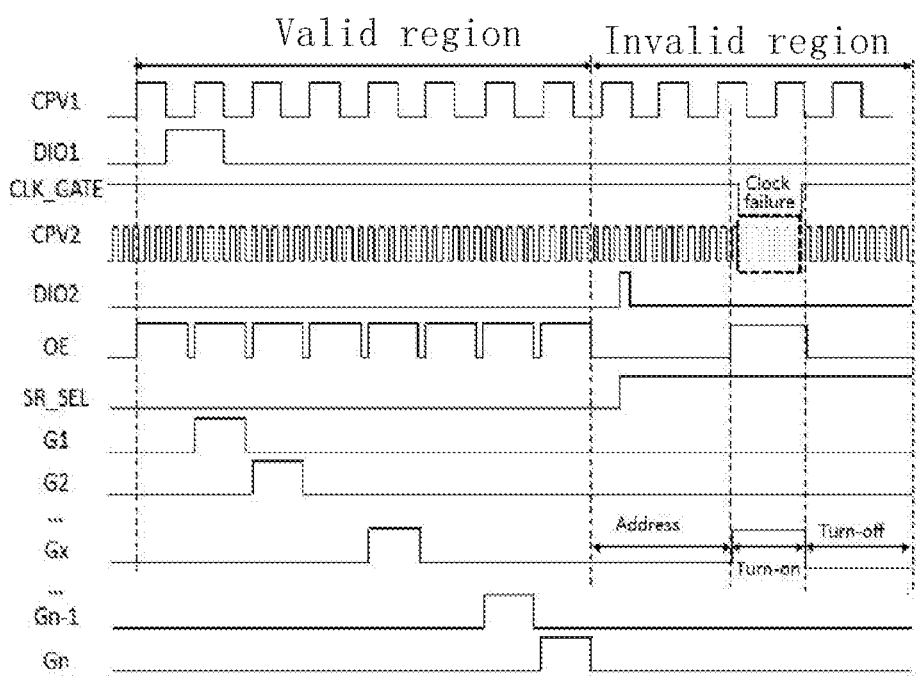
FIG. 5 is a schematic view of a signal timing of FIG. 4.

Please refer to FIG. 5. FIG. 5 is a schematic view of a signal timing of scan driver of this present invention. As shown in FIG. 4 and FIG. 5, the working principle of the first shift register 10 for scanning scan lines by the first scanning type (which is progressive scanning) described below.

Address stage: rapid scans to correspondingly scan line. In order to not affect display of panel, the entire scan lines in turn-off status, the output enable signal OE received from the logic control unit 40 from controller 70 is low potential level. At this time, the scan driver does not outputting, the first shift register 10 receiving the first clock signal CPV1 and the first initial pulse signal DIO1, and then the first shift register 10 working and the first shift register 10 scans a first scan line (forward scan, which is from first scan line progressive scan to last scan line, here will illustrate by forward scan) or last scan line (backward scan, which is from last scan line progressive scan to first scan line).

Turn-on stage: turn-on the correspondingly scan line, and turn-on the scan line for a certain time. When the scan driver scans the correspondingly scan line (for example the first scan line), the output enable signal OE received by the logic control unit 40 from controller 70 is high potential level. At this time, the scan driver outputs a scan driver signal for controlling to turn-on the correspondingly scan line (for example the first scan line). Because a clock cycle is short, it cannot satisfy needs of turn-on time, such that the controller 70 outputs a gated clock signal CLK_GATE has low potential level to the first shift register 10, and made the first clock signal CPV1 failure. It could achieved to turn-on a certain time to the correspondingly scan line.

Turn-off stage: turn-off the correspondingly scan line which already turn-on, and finish to scan other scan lines. When the corresponding scan line already turn-on for the certain time, the controller 70 outputs a gated clock signal CLK_GATE has high potential level to the first shift register 10, enables the first clock signal CPV1. The scan driver will keep forward scan to other scan lines (for example a second scan line). When turn-off the correspondingly scan line which already turn-on, the scan principle for other scan lines as same as the described above, here is not repeat again. According the scan process above could achieve to progressive turn-on the scan line and holding a certain time, and it could achieve to progressive scanning.

The working principle of the second shift register 20 for scanning scan lines by the second scanning type (which is non-sequential scanning) described below.

Address stage: rapidly scans to scan line which needs to turn-on. In order to not affect display of panel, the entire scan lines in turn-off status, the output enable signal OE received from the logic control unit 40 from controller 70 is low potential level. At this time, the scan driver does not outputting, the second shift register 20 receiving the second clock signal CPV2 and the second initial pulse signal DIO2, then working to more highly frequency, and made the second shift register 20 rapidly scans to scan line which needs to turn-on.

Turn-on stage: turn-on the scan line which needs to turn-on, and holding the turn-on scan line for a certain time. When the scan driver scans the scan line which need to turn-on, the output enable signal OE received by the logic control unit 40 from controller 70 is high potential level. At this time, the scan driver outputs a scan driver signal for controlling to turn-on the scan line which needs to turn-on. Because a clock cycle is short, it cannot satisfy the needs turn-on time, such that the controller 70 outputs a gated clock signal CLK_GATE has low potential level to the second shift register 20, and made the second clock signal CPV2 failure. It could achieve to turn-on a certain time to the scan line which needs to turn-on.

Turn-off stage: turn-off the scan line which need to turn-on, and finishing to scan other scan lines which needs to turn-on. When the scan line which needs turn-on already turn-on for the certain time, the controller 70 outputs a gated clock signal CLK_GATE has high potential level to the second shift register 20, enables the second clock signal CPV2. The scan driver will keep to forward scan other scan lines which need to turn-on. When turn-off the scan line which needs turn-on, the scan principle for other scan lines as same as the described above, here is not repeat again. According the scan process above could achieve to progressive turn-on the scan line which needs turn-on and holding a certain time, and it could achieve to progressive scanning.

Figure 6:
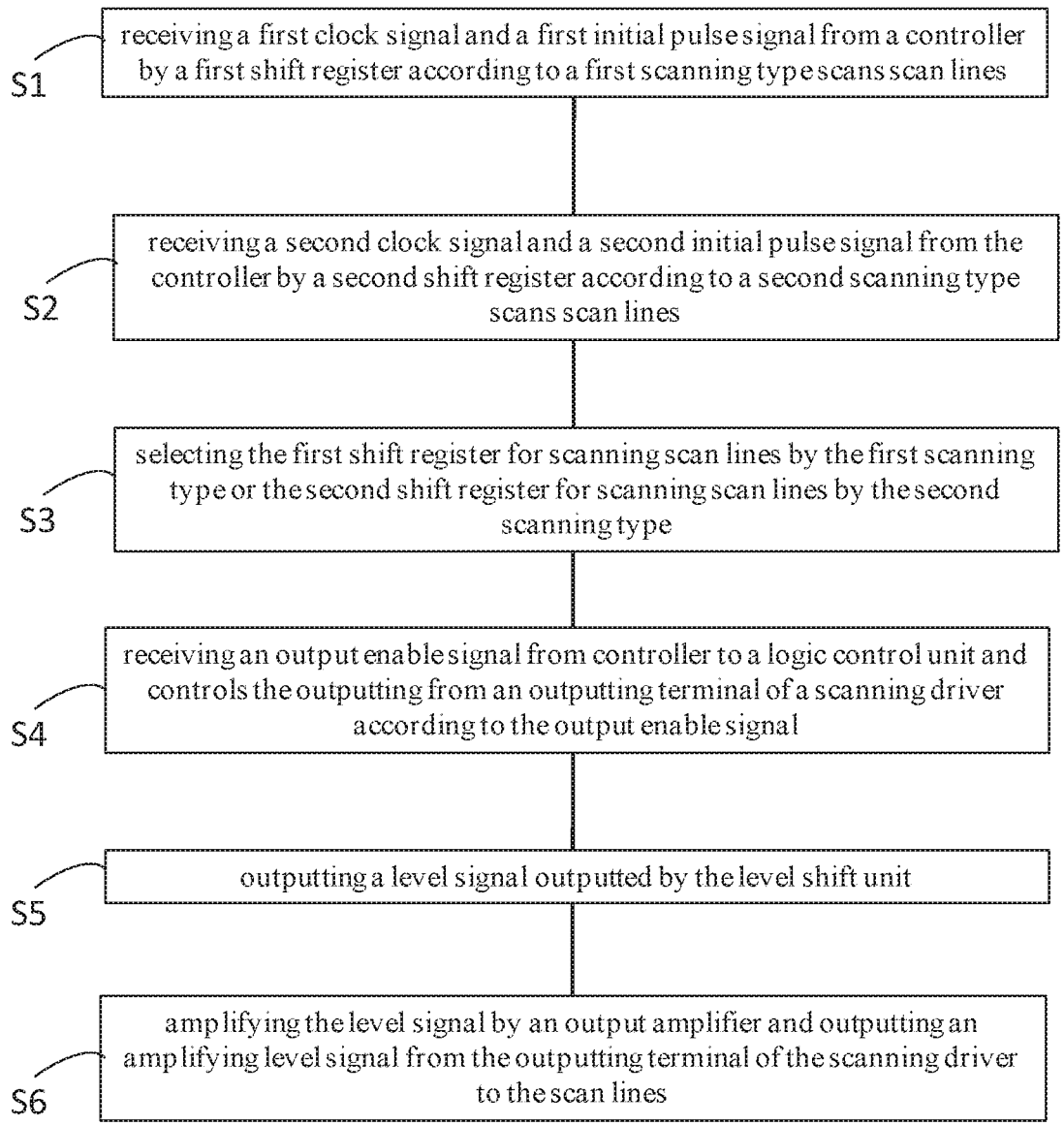
FIG. 6 is a flowchart schematic view of a driving method of scan driver according to an embodiment of the disclosure.

Please refer to FIG. 6. FIG. 6 is a flowchart schematic view of a driving method of scan driver according to an embodiment of the disclosure.

Step S1, receiving a first clock signal CPV1 and a first initial pulse signal DIO1 from a controller 70 by a first shift register 10 according to a first scanning type scans scan lines;

Step S2, receiving a second clock signal CPV2 and a second initial pulse signal DIO2 from the controller 70 by a second shift register 20 according to a second scanning type scans scan lines;

Step S3, receiving selection signals from the controller 70 to a selection unit 30 for selecting the first shift register 10 for scanning scan lines by the first scanning type or the second shift register 20 for scanning scan lines by the second scanning type;

Step S4, receiving an output enable signal OE from controller 70 to a logic control unit 40 and controls the outputting from an outputting terminal Gn of a scanning driver according to the output enable signal OE;

Step S5, outputting a level signal outputted by the level shift unit 50; and

Step S6, amplifying the level signal by an output amplifier 60 and outputting an amplifying level signal from the outputting terminal Gn of the scanning driver to the scan lines.

Wherein, the step S1 includes:
scanning a valid region by the first shift register 10 for progressive scanning;

Wherein, the step S2 includes:
scanning a invalid region by the second shift register 20 for non-sequential scanning.

Wherein, the step S3 includes:
the selection signals include a first selection signal and a second selection signal, the selection unit 30 selects the first shift register 10 for scanning scan lines by the first scanning type according to receive the first selection signal, the selection unit 30 selects the second shift register 20 for scanning scan lines by the second scanning type according to receive the second selection signal.

The scan driver and driving method of scan driver is that using the first shift register to achieve progressive scanning and using the second shift register to achieve non-sequential scanning, and the selection unit revived selection signal from the controller and select working the first shift register or the second shift register. And then the logic control unit controls to outputting of the output terminal of scan driver. It achieves to satisfy requirement of progressive scanning and non-sequential scanning of scan driver.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A scan driver, comprising
a first shift register receiving a first clock signal and a first initial pulse signal from a controller according to a first scanning type scans scan lines;
a second shift register receiving a second clock signal and a second initial pulse signal from the controller according to a second scanning type scans scan lines;
a selection unit connecting the first shift register and the second shift register, which receiving selection signals from the controller to select the first shift register for scanning scan lines by the first scanning type or the second shift register for scanning scan lines by the second scanning type;
a logic control unit connecting the selection unit, which receiving an output enable signal from the controller and controls the outputting from an outputting terminal of a scanning driver according to the output enable signal;
a level shift unit connecting the logic control unit, which outputting a level signal; and
an output amplifier connecting the level shift unit, which amplifying the level signal and outputting an amplifying level signal from the outputting terminal of the scanning driver to the scan lines;
wherein frequency of the first shift register is less than frequency of the second shift register, and the first shift register scans a valid region by progressive scanning, the second shift register scans invalid region by non-sequential scanning;
wherein the selection signals received by the selection unit from the controller include a first selection signal and a second selection signal, the selection unit selects the first shift register for scanning scan lines by the first scanning type according to receive the first selection signal, the selection unit selects the second shift register for scanning scan lines by the second scanning type according to receive the second selection signal.

2. A scan driver, comprising:
- a first shift register receiving a first clock signal and a first initial pulse signal from a controller according to a first scanning type scans scan lines;
- a second shift register receiving a second clock signal and a second initial pulse signal from the controller according to a second scanning type scans scan lines;
- a selection unit connecting the first shift register and the second shift register, which receiving selection signals from the controller to select the first shift register for scanning scan lines by the first scanning type or the second shift register for scanning scan lines by the second scanning type;
- a logic control unit connecting the selection unit, which receiving an output enable signal from the controller and controls the outputting from an outputting terminal of a scanning driver according to the output enable signal;
- a level shift unit connecting the logic control unit, which outputting a level signal; and
- an output amplifier connecting the level shift unit, which amplifying the level signal and outputting an amplifying level signal from the outputting terminal of the scanning driver to the scan lines.

3. The scan driver according to claim 2, wherein frequency of the first shift register is less than frequency of the second shift register, and the first shift register scans a valid region by progressive scanning, the second shift register scans invalid region by non-sequential scanning.

4. The scan driver according to claim 2, wherein the selection signals received by the selection unit from the controller include a first selection signal and a second selection signal, the selection unit selects the first shift register for scanning scan lines by the first scanning type according to receive the first selection signal, the selection unit selects the second shift register for scanning scan lines by the second scanning type according to receive the second selection signal.

5. The scan driver according to claim 2, wherein the first shift register and the second shift register further receiving a gated clock signal from the controller, and elongating enabling time of the scan lines by the gate clock signal.

6. The scan driver according to claim 2, wherein frequency the second clock signal received by the second shift register is according to formula $f_{CPV2} >= (N-1)/(t_{VB} - t_{OPEN})$, wherein $f_{CPV2}$ is frequency of the second clock signal, N is number of scan lines, $t_{VB}$ is time of invalid time, $t_{OPEN}$ is enabling time of scan lines.

7. A driving method of scan driver, comprising:
- receiving a first clock signal and a first initial pulse signal from a controller by a first shift register according to a first scanning type scans scan lines;
- receiving a second clock signal and a second initial pulse signal from the controller by a second shift register according to a second scanning type scans scan lines;
- receiving selection signals from the controller to a selection unit for selecting the first shift register for scanning scan lines by the first scanning type or the second shift register for scanning scan lines by the second scanning type;
- receiving an output enable signal from the controller to a logic control unit and controls the outputting from an outputting terminal of a scanning driver according to the output enable signal;
- outputting a level signal outputted by the level shift unit; and
- amplifying the level signal by an output amplifier and outputting an amplifying level signal from the outputting terminal of the scanning driver to the scan lines.

8. The driving method of scan driver according to claim 7, wherein the step of receiving the first clock signal and a first initial pulse signal from the controller by the first shift register according to the first scanning type scans scan lines, comprising:
- scanning a valid region by the first shift register for progressive scanning;
- wherein the step of receiving the second clock signal and the second initial pulse signal from the controller by the second shift register according to the second scanning type scans scan lines, comprising:
- scanning a invalid region by the second shift register for non-sequential scanning.

9. The driving method of scan driver according to claim 7, wherein the step of receiving selection signals from the controller to selection unit for selecting the first shift register for scanning scan lines by the first scanning type or the second shift register for scanning scan lines by the second scanning type, comprising:
- the selection signals include a first selection signal and a second selection signal, the selection unit selects the first shift register for scanning scan lines by the first scanning type according to receive the first selection signal, the selection unit selects the second shift register for scanning scan lines by the second scanning type according to receive the second selection signal.

10. The driving method of scan driver according to claim 7, wherein the controller outputting a gated clock signal to the first shift register and the second shift register, and elongating enabling time of the scan lines by the gate clock signal.

11. The driving method of scan driver according to claim 7, wherein frequency the second clock signal received by the second shift register is according to formula $f_{CPV2} >= (N-1)/(t_{VB} - t_{OPEN})$, wherein $f_{CPV2}$ is frequency of the second clock signal, N is number of scan lines, $t_{VB}$ is time of invalid time, $t_{OPEN}$ is enabling time of scan lines.

* * * * *